(12) United States Patent
Maarouf et al.

(10) Patent No.: US 11,984,273 B1
(45) Date of Patent: *May 14, 2024

(54) SOLAR CELL WITH TRANSPARENT ELECTRODE

(71) Applicant: Imam Abdulrahman Bin Faisal University, Dammam (SA)

(72) Inventors: Ahmed A. Maarouf, Dammam (SA); Khaled Abdelsabour Mohamed Elsayed, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/317,325

(22) Filed: May 15, 2023

Related U.S. Application Data

(60) Continuation of application No. 17/954,378, filed on Sep. 28, 2022, now Pat. No. 11,699,767, which is a
(Continued)

(51) Int. Cl.
*H01G 9/20* (2006.01)
*B82Y 30/00* (2011.01)
(Continued)

(52) U.S. Cl.
CPC .............. *H01G 9/20* (2013.01); *B82Y 30/00* (2013.01); *C01B 32/186* (2017.08); *C23C 16/01* (2013.01); *C23C 16/0254* (2013.01); *C23C 16/26* (2013.01); *C23C 16/342* (2013.01); *H01G 9/2045* (2013.01); *H01L 31/0224* (2013.01);
(Continued)

(58) Field of Classification Search
CPC ......... H01L 31/0224; H01L 31/022425; H01L 31/022466; H01G 9/20; H01G 9/2013; H01G 9/2045; B82Y 30/00
See application file for complete search history.

(56) References Cited

U.S. PATENT DOCUMENTS

| | | | |
|---|---|---|---|
| 8,900,390 | B2 | 12/2014 | Jiang |
| 8,968,587 | B2 | 3/2015 | Shin et al. |

(Continued)

FOREIGN PATENT DOCUMENTS

| | | |
|---|---|---|
| CN | 102496668 A | 6/2012 |
| CN | 102660740 A | 9/2012 |

(Continued)

OTHER PUBLICATIONS

C. Ingrosso, et al. "TiO2 nanocrystals decorated CVD graphene for electroanalytical sensing." Nano/Micro Engineered and Molecular Systems (NEMS), 2017 IEEE 12th International Conference on, Los Angeles, CA USA Apr. 9-12, 2017, 4 pages.

(Continued)

Primary Examiner — Lindsey A Buck
(74) Attorney, Agent, or Firm — Oblon, McClelland, Maier & Neustadt, L.L.P.

(57) ABSTRACT

A transparent electrode with a transparent substrate and a composite layer disposed thereon, wherein the composite layer includes a graphene layer and a plurality of nanoparticles, wherein the nanoparticles are embedded in the graphene layer and extend through a thickness of the graphene layer, and wherein the plurality of nanoparticles are in direct contact with the transparent substrate and a gap is present between the graphene layer and the transparent substrate.

12 Claims, 8 Drawing Sheets

Related U.S. Application Data continuation of application No. 17/727,053, filed on Apr. 22, 2022, now Pat. No. 11,486,036, which is a continuation of application No. 17/344,455, filed on Jun. 10, 2021, now Pat. No. 11,384,427, which is a division of application No. 15/961,326, filed on Apr. 24, 2018, now Pat. No. 11,117,801.

(51) Int. Cl.
| | | |
|---|---|---|
| *B82Y 40/00* | (2011.01) | |
| *C01B 32/186* | (2017.01) | |
| *C23C 16/01* | (2006.01) | |
| *C23C 16/02* | (2006.01) | |
| *C23C 16/26* | (2006.01) | |
| *C23C 16/34* | (2006.01) | |
| *H01L 31/0224* | (2006.01) | |

(52) U.S. Cl.
CPC ............. *H01L 31/022425* (2013.01); *H01L 31/022466* (2013.01); *B82Y 40/00* (2013.01); *H01G 9/2013* (2013.01); *Y10S 977/734* (2013.01); *Y10S 977/843* (2013.01); *Y10S 977/948* (2013.01)

(56) References Cited

U.S. PATENT DOCUMENTS

| | | |
|---|---|---|
| 11,117,801 B2 | 9/2021 | Maarouf |
| 2007/0056628 A1 | 3/2007 | Park |
| 2009/0194834 A1 | 8/2009 | Park et al. |
| 2009/0308442 A1 | 12/2009 | Liu |
| 2012/0282489 A1 | 11/2012 | Shin et al. |
| 2017/0114450 A1 | 4/2017 | Babenko et al. |

FOREIGN PATENT DOCUMENTS

| | | |
|---|---|---|
| IN | 201208604 P1 | 1/2016 |
| WO | WO 2009000969 A1 | 12/2008 |
| WO | WO 2012086387 A1 | 6/2012 |

OTHER PUBLICATIONS

C. Ingrosso, et al., "TiO2 Nanocrystals Decorated CVD Graphene Based Hybrid for UV-Light Active Photoanodes," Procedia Engineering, vol. 168, 2016, pp. 396-402.

Jeong, et al. "One-Step Transfer and Integration of Multifunctionality in CVD Graphene by TiO2/Graphene Oxide Hybrid Layer," Small, vol. 10, Issue10, May 28, 2014 (First Published Feb. 28, 2014). pp. 2057-2066.

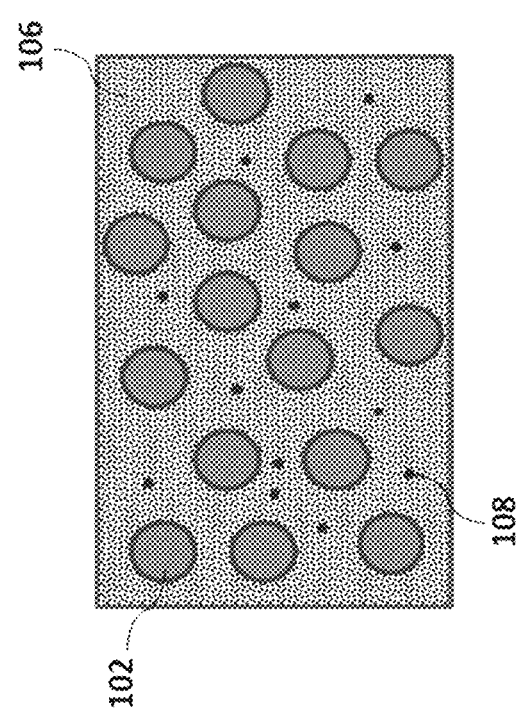
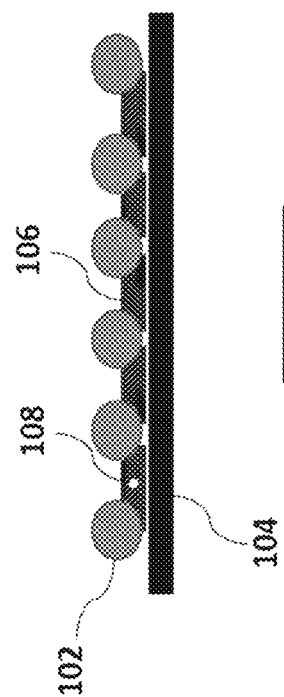

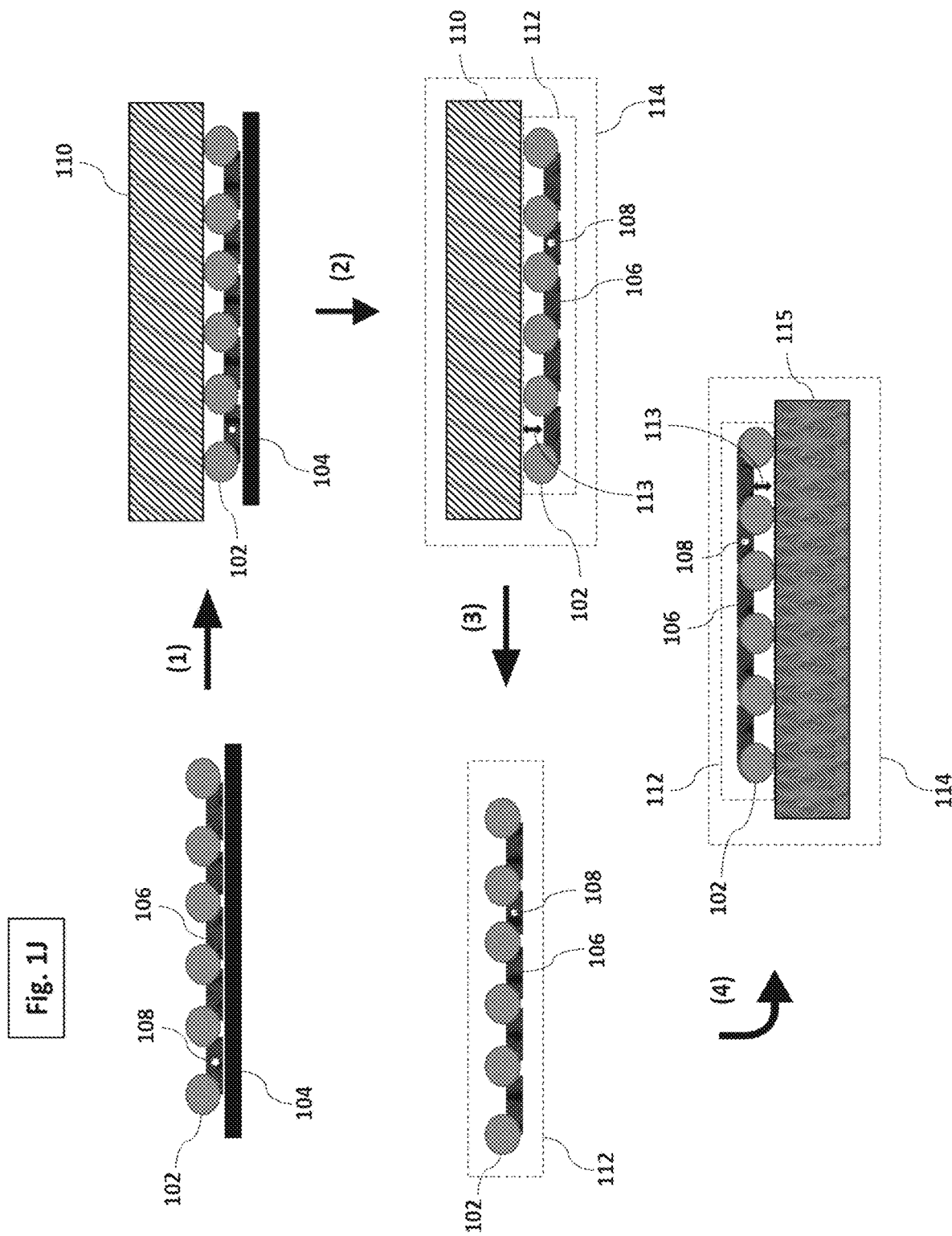

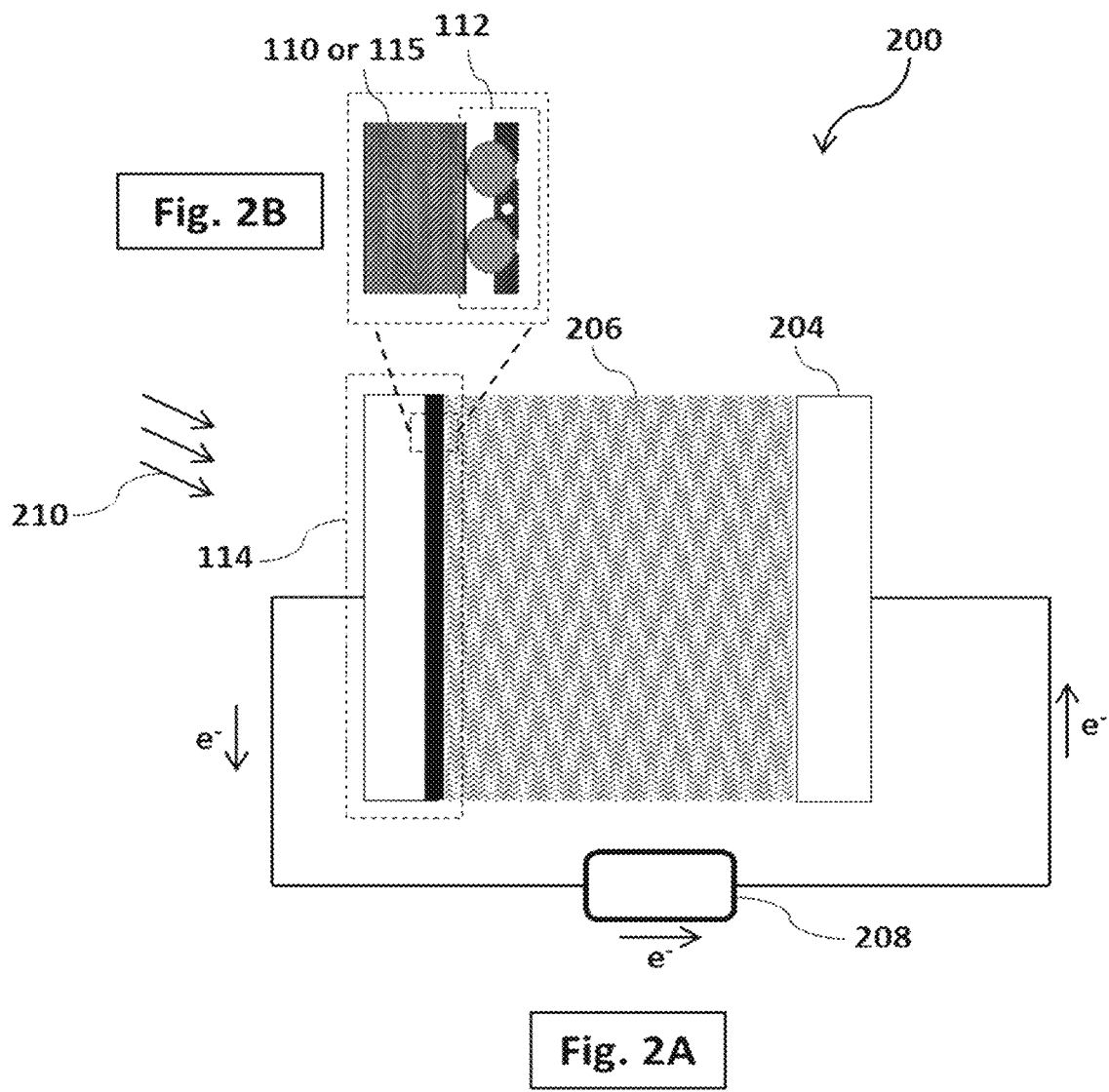

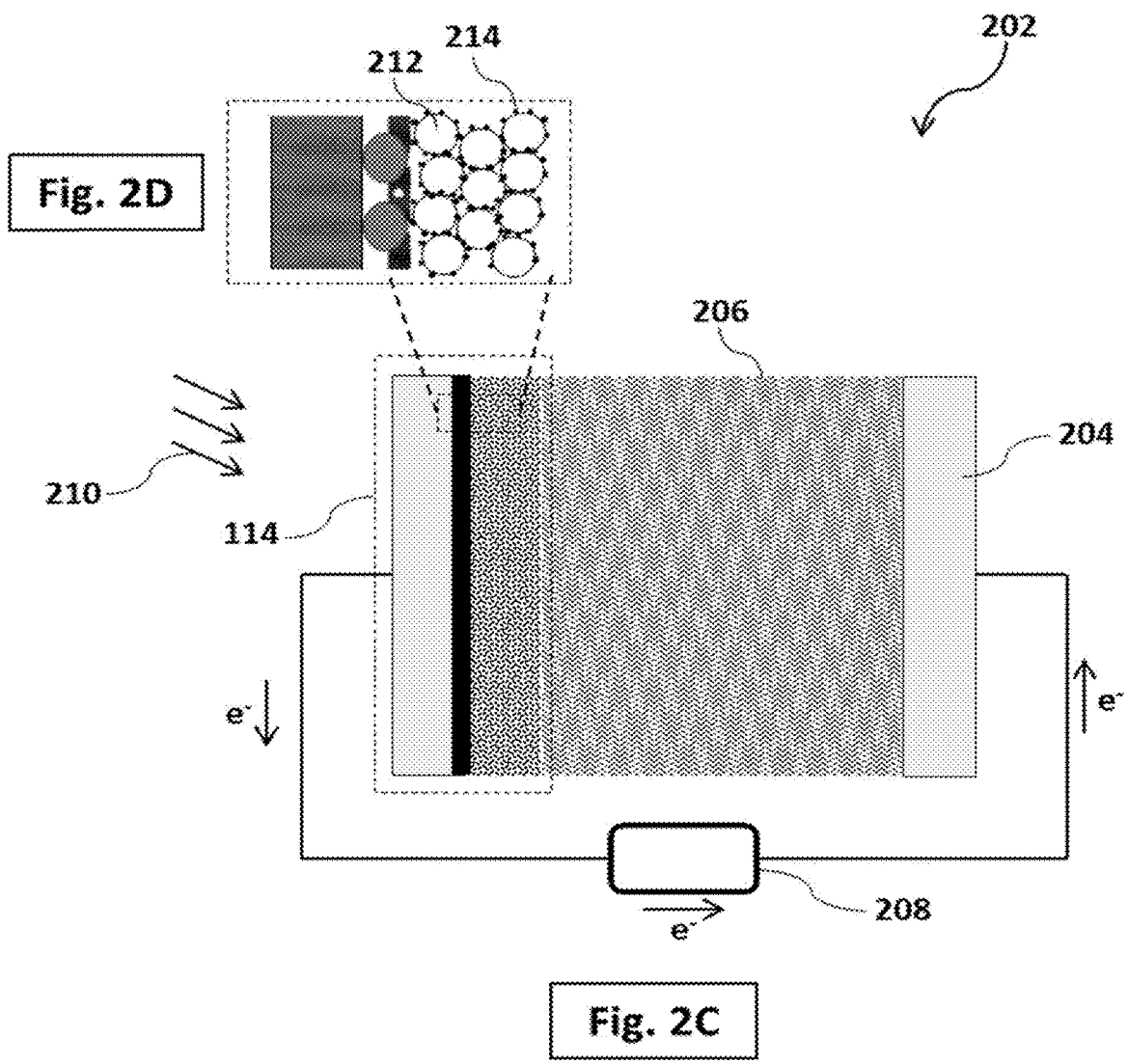

SOLAR CELL WITH TRANSPARENT ELECTRODE

CROSS-REFERENCE TO RELATED APPLICATIONS

The present application is a Continuation of U.S. application Ser. No. 17/954,378, now allowed, having a filing date of Sep. 28, 2022, which is a Continuation of U.S. application Ser. No. 17/727,053, now U.S. Pat. No. 11,486,036, having a filing date of Apr. 22, 2022, which is a Continuation of U.S. application Ser. No. 17/344,455, now U.S. Pat. No. 11,384,427, having a filing date of Jun. 10, 2021, which is a Divisional of U.S. application Ser. No. 15/961,326, now U.S. Pat. No. 11,117,801, having a filing date of Apr. 24, 2018.

BACKGROUND OF THE INVENTION

Technical Field

The present invention relates to a transparent electrode with a transparent substrate and a composite layer having a graphene layer and a plurality of nanoparticles embedded therein, wherein a gap is present between the graphene layer and the transparent substrate.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Graphene has some fascinating physical properties that are currently not fully utilized. For example, graphene has very high electronic mobility. Several studies reported the average electronic mobility of graphene to be at least 15,000 cm$^2$/(V·s), with a theoretical potential limit of around 200,000 cm$^2$/(V·s) for a free-standing monolayer graphene. The theoretical upper bound is limited by the scattering of graphene's acoustic photons. In a free-standing monolayer graphene, electrons act like photons and are able to travel sub-micrometer distances without scattering. However, the electron mobility of graphene is substantially limited due to the presence of a substrate that carries the graphene. With silicon dioxide as the substrate, for example, the electron mobility of a graphene is substantially reduced to a value of no more than 40,000 cm$^2$/(V·s).

In view of the forgoing, one objective of the present disclosure is to provide a transparent electrode with a transparent substrate and a composite layer disposed thereon, wherein the composite layer includes a graphene layer and a plurality of nanoparticles, wherein the nanoparticles are embedded in the graphene layer and extend through a thickness of the graphene layer, and wherein the plurality of nanoparticles are in direct contact with the transparent substrate and a gap is present between the graphene layer and the transparent substrate.

BRIEF SUMMARY OF THE INVENTION

According to a first aspect, the present disclosure relates to a transparent electrode including i) a transparent substrate, ii) a composite layer disposed on the transparent substrate, wherein the composite layer includes a graphene layer and a plurality of nanoparticles, wherein the nanoparticles are embedded in the graphene layer and extend through a thickness of the graphene layer, and wherein at least a portion of the plurality of nanoparticles are in direct contact with the transparent substrate and a gap is present between the graphene layer and the transparent substrate In one embodiment, a ratio of the thickness of the graphene layer to an average diameter of the plurality of nanoparticles is 1:1.5 to 1:10.

In one embodiment, the nanoparticles are at least one selected from the group consisting of a boron nitride nanotube, a boron nitride fullerene, a titanium oxide nanotube, and a titanium oxide fullerene.

In one embodiment, the nanoparticles are boron nitride nanotubes with an average diameter of 3-10 nm.

In one embodiment, the nanoparticles have a morphology selected from the group consisting of a tubular morphology, a spherical morphology, an elliptical morphology, and an oblong morphology.

In one embodiment, the gap defines a distance between the graphene layer and the transparent substrate, wherein an average size of the gap is 0.1-10 nm.

In one embodiment, the composite layer further includes a p-type dopant, which is dispersed in the graphene layer.

In one embodiment, the p-type dopant is diborane.

In one embodiment, the composite layer further includes an n-type dopant, which is dispersed in the graphene layer.

In one embodiment, the n-type dopant is ammonia.

In one embodiment, the composite layer further includes quantum dots.

In one embodiment, the transparent substrate is at least one selected from the group consisting of quartz, glass, polyethylene terephthalate, polybutylene terephthalate, polyacrylate, polymethacrylate, polymethylmethacrylate, polydimethylsiloxane, polyethylene, polypropylene, polyvinyl chloride, polyethernitrile, polyethersulfone, polystyrene, polycarbonate, styrene acrylonitrile, styrene methyl methacrylate, and methyl metacrylate butadiene styrene.

In one embodiment, the composite layer has an electron mobility of at least 30,000 cm$^2$/(V·s) at a temperature of 20-30° C.

In one embodiment, the composite layer has a light transmittance of at least 95% when exposed to a light radiation with a wavelength of 300 to 1,000 nm.

According to a second aspect, the present disclosure relates to a solar cell including i) the transparent electrode, ii) a cathode, iii) an electrolyte arranged between the transparent electrode and the cathode, wherein the transparent electrode is in electric communication with the cathode through the electrolyte.

According to a third aspect, the present disclosure relates to a method of fabricating the transparent electrode involving i) depositing the plurality of nanoparticles on a surface of a CVD substrate, ii) heating the CVD substrate and said nanoparticles to a temperature of at least 900° C. at a sub-atmospheric pressure, iii) contacting a gaseous mixture comprising methane and hydrogen with said nanoparticles and the CVD substrate, wherein hydrogen catalyzes a reaction between methane and the CVD substrate to deposit carbon atoms on the surface of the CVD substrate thereby forming the composite layer, wherein the nanoparticles are embedded in the graphene layer and extend through a thickness of the graphene layer, iv) cooling the CVD substrate and the composite layer, v) disposing the transparent substrate on the composite layer, vi) removing the CVD substrate with an etchant thereby fabricating the transparent electrode, wherein said nanoparticles are in direct contact with the transparent substrate and a gap is present between the graphene layer and the transparent substrate.

In one embodiment, the transparent substrate is a polymeric material, wherein disposing the transparent substrate on the composite layer is carried out by coating the composite layer with the polymeric material.

In one embodiment, the CVD substrate is a copper substrate, wherein the etchant is ferric chloride.

In one embodiment, the polymeric material is polydimethylsiloxane and/or polymethylmethacrylate, wherein the organic solvent is acetone.

In one embodiment, the gaseous mixture further includes diborane, wherein the composite layer is a p-type semiconductor.

In one embodiment, the gaseous mixture further includes ammonia, wherein the composite layer is an n-type semiconductor.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1H schematically illustrates a top-view of the CVD substrate after depositing graphene, wherein the graphene is deposited in the presence of a dopant.

FIG. 1I schematically illustrates a side-view of the CVD substrate after depositing graphene, wherein the graphene is deposited in the presence of a dopant.

FIG. 1J schematically illustrates processing steps of fabricating the transparent electrode: (1) disposing the transparent substrate on the composite layer, (2) removing the CVD substrate, (3) optionally removing the transparent substrate, and (4) optionally placing the composite layer on another substrate.

FIG. 2A schematically illustrates a solar cell, wherein the transparent substrate is the working electrode of the solar cell.

FIG. 2B schematically illustrates a magnified view of the working electrode of the solar cell.

FIG. 2C schematically illustrates a dye-sensitized solar cell, wherein the transparent substrate is the working electrode of the dye-sensitized solar cell.

FIG. 2D schematically illustrates a magnified view of the working electrode of the dye-sensitized solar cell.

DETAILED DESCRIPTION OF THE EMBODIMENTS

Figure 1A:
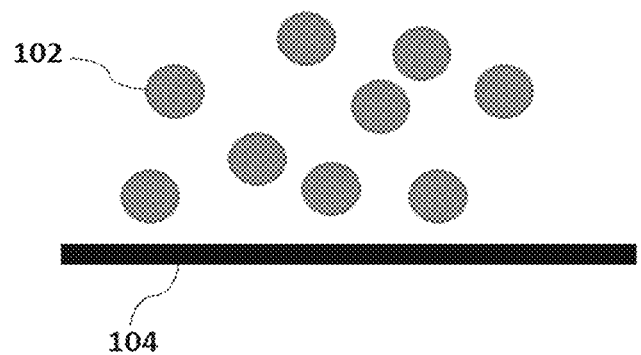
FIG. 1A schematically illustrates a side-view of a CVD substrate during depositing nanoparticles.
Figure 1C:
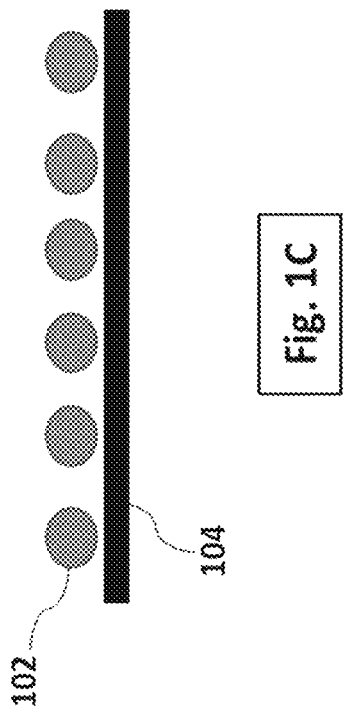
FIG. 1C schematically illustrates a side-view of the CVD substrate after depositing the nanoparticles thereon.
Figure 1B:
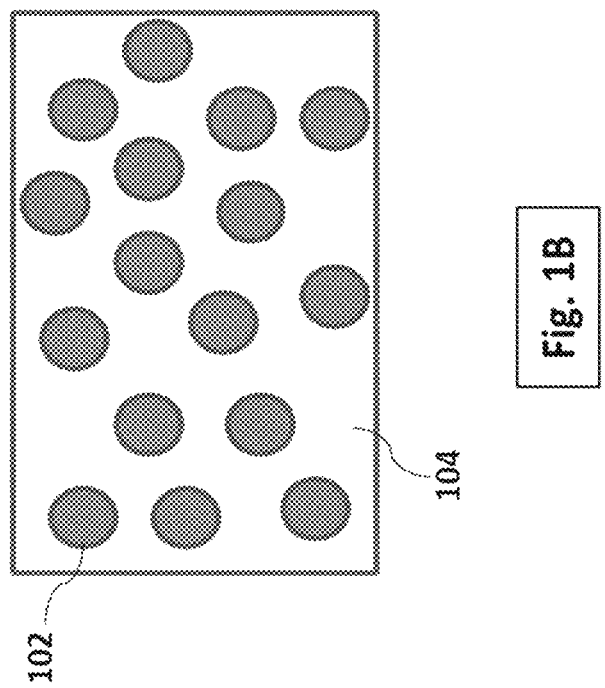
FIG. 1B schematically illustrates a top-view of the CVD substrate after depositing the nanoparticles thereon.

Embodiments of the present disclosure will now be described more fully hereinafter with reference to the accompanying drawings, in which some, but not all embodiments of the disclosure are shown.

The present disclosure will be better understood with reference to the following definitions. As used herein, the words "a" and "an" and the like carry the meaning of "one or more." Within the description of this disclosure, where a numerical limit or range is stated, the endpoints are included unless stated otherwise. Also, all values and subranges within a numerical limit or range are specifically included as if explicitly written out.

Referring to FIGS. 1A-1J, according to a first aspect, the present disclosure relates to a transparent electrode 114. The term "transparent electrode" as used in this disclosure refers to an electrode, which preferably has a light transmittance of at least 50%, preferably at least 60%, preferably 65-95%, preferably 75-90% when exposed to a light radiation with a wavelength of 300-1,000 nm, preferably 350-900 nm, preferably 400-800 nm. In terms of the present disclosure, transmittance of a material is an ability of the material to transmit radiant energy therethrough; therefore, the "light transmittance" is a percentage of radiant energy that is transmitted through a material which is not lost due to absorption, scattering, reflection, etc.

The transparent electrode 114 includes at least a transparent substrate 110 and a composite layer 112, as shown in FIG. 1J. Each component of the transparent electrode is fully described hereinafter.

The term "transparent substrate" refers to a transparent material that is used as a support for the composite layer 112. In view of that, the transparent substrate 110 may be any one of glass, quartz, a transparent polymeric material, etc. In one embodiment, the transparent substrate 110 is planar (in the form of a plane). In certain embodiments, a thickness of the transparent substrate 110 may be within the range of 5 to 500 µm, preferably 10 to 400 µm, more preferably 50 to 300 µm. Alternatively, the transparent substrate 110 may have a rectangular shape with a thickness of 1 to 10 mm, preferably 2 to 8 mm, preferably 3 to 5 mm. In certain embodiments, the transparent substrate 110 may have a cylindrical shape or a spherical shape. The transparent substrate 110 may be flexible or rigid depending on the application of the transparent electrode 114.

In some embodiments, the transparent substrate 110 has a light transmittance of at least 50%, preferably at least 60%, preferably 65-95%, preferably 75-90% when exposed to a light radiation with a wavelength of 300-1,000 nm, preferably 350-900 nm, preferably 400-800 nm.

In a preferred embodiment, the transparent substrate 110 is a transparent polymeric material. Exemplary transparent polymeric materials may include, without limitation, polyethylene terephthalate, polybutylene terephthalate, polyethylene terephthalate glycol-modified, polyethylene-2,6-naphthalate, triacetyl cellulose, liquid crystal polymers such as thermotropic liquid crystal polyester and thermotropic liquid crystal polyester amide, acrylic resins such as polyacrylate and polymethacrylate, olefin resins such as polyethylene and polypropylene, vinyl resins such as polyvinyl chloride, an ethylene-vinyl acetate copolymer, and an ethylene-vinyl alcohol copolymer, imide resins such as polyimide and polyamide-imide, and ether resins such as polyethernitrile, polyether sulfone, polystyrene, polycarbonate, polymethylmethacrylate, polydimethylsiloxane, styrene acrylonitrile, styrene methyl methacrylate, methyl methacrylate butadiene styrene, and any combinations thereof. In a preferred embodiment, the transparent substrate 110 is polymethylmethacrylate (PMMA), polydimethylsiloxane (PDMS), or polycarbonate (PC).

In some embodiments, the transparent substrate 110 is an inorganic transparent material in lieu of or in addition to the transparent polymeric material. Exemplary inorganic transparent materials that may be used include, without limitation, an indium-doped tin oxide, a fluorine-doped tin oxide, a zinc-doped tin oxide, a gallium-doped tin oxide, and combinations thereof.

The transparent electrode 114 further includes the composite layer 112, which is disposed on the transparent substrate 110. The composite layer 112 includes a graphene layer 106 and a plurality of nanoparticles 102, wherein the nanoparticles 102 are embedded in the graphene layer 106 and extend through a thickness of the graphene layer 106, wherein the nanoparticles 102 are in direct contact with the transparent substrate 110 and a gap 113 is present between the graphene layer 106 and the transparent substrate 110, as shown in FIG. 1J.

The "gap" defines a distance between the graphene layer 106 and the transparent substrate 110. In some preferred embodiments, an average size of the gap 113 is 0.1-10 nm, preferably 0.5-8 nm, preferably 1-6 nm, preferably 2-5 nm.

In some preferred embodiments, the nanoparticles 102 are at least one selected from the group consisting of a boron nitride nanotube, a boron nitride fullerene, a titanium oxide nanotube, and a titanium oxide fullerene. In alternative embodiments, the nanoparticles 102 may include graphene nanoribbons, chalcogenide nanotubes, and metal chalcogenide nanotubes.

The nanoparticles 102 may have a morphology selected from the group consisting of a tubular morphology, a spherical morphology, an elliptical morphology, and an oblong morphology. In certain embodiments, the nanoparticles 102 may have a morphology selected from a nanosphere, a nanosheet, a nanotube, a nanofiber, a nanowire, a nanodisc, a nanocube, a nanorod, a nanoring, and a nanostar.

In a preferred embodiment, the nanoparticles 102 are boron nitride nanotubes (BNNTs) with an average diameter of 3-20 nm, preferably 4-15 nm, preferably 5-10 nm. The BNNTs may be single walled BNNTs or preferably multi-walled BNNTs. The BNNTs may be present in the form of functionalized boron nitride nanotubes, polymer wrapped boron nitride nanotubes, un-functionalized boron nitride nanotubes, and combinations thereof. In some preferred embodiments, the nanoparticles 102 are functionalized boron nitride nanotubes, wherein the boron nitride nanotubes are covalently and/or non-covalently functionalized with a plurality of functional groups. Exemplary functional groups include, without limitation, alkyl groups, alcohol groups, carboxyl groups, carbonyl groups, alkoxy groups, aryl groups, aryl sulfonyl groups, polymers, sulfur groups, organic compounds, surfactants, graphene quantum dots, carbon quantum dots, inorganic quantum dots, and combinations thereof. In more specific embodiments, the boron nitride nanotubes may be functionalized with polymers such as, without limitations, poly(alkyl) oxides, poly(ethylene) oxides, poly(propylene) oxides, and combinations thereof. In some embodiments, the boron nitride nanotubes may be functionalized with water soluble triblock polymers.

In certain embodiments, carbon nanomaterials may be utilized in lieu of or in addition to the abovementioned nanoparticles 102. Exemplary carbon nanomaterials that may be utilized here may include, but are not limited to carbon nanotube, fullerene, nanodiamond, etc. For example, in some embodiments, the nanoparticles 102 are carbon nanotubes. The carbon nanotubes may be present in the composite layer 112 in the form of functionalized carbon nanotubes, polymer wrapped carbon nanotubes, metallic carbon nanotubes, semi-metallic carbon nanotubes, single-walled carbon nanotubes, double-walled carbon nanotubes, multi-walled carbon nanotubes, ultra-short carbon nanotubes, and combinations thereof.

In some embodiments, the nanoparticles 102 are chalcogenide nanotubes such as, for example, metal chalcogenide nanotubes, metal monochalcogenide nanotubes, metal dichalcogenide nanotubes, metal trichalcogenide nanotubes, molybdenum disulfide ($MoS_2$) nanotubes, molybdenum trisulfide ($MoS_3$) nanotubes, titanium diselenide ($TiSe_2$) nanotubes, molybdenum diselenide ($MoSe_2$) nanotubes, tungsten diselenide ($WSe_2$) nanotubes, tungsten disulfide ($WS_2$) nanotubes, niobium triselenide ($NbSe_3$) nanotubes, and combinations thereof.

In certain embodiments, the nanoparticles 102 may be present in the composite layer 112 as agglomerates. As used herein, the term "agglomerates" refers to clusters or clumps of the nanoparticles with an average diameter of no more than 3 times, preferably no more than 2 times of the average diameter of the nanoparticles 102.

The term "graphene layer" as used in this disclosure refers to a layer (or a plurality of stacked layers) of graphene sheets deposited on the surface of a CVD substrate, and the nanoparticles 102 are embedded in the graphene layer 106 and extend through a thickness of the graphene layer 106. The graphene layer may fill nano/micro size roughness concaves and/or convexes of the CVD substrate. A thickness of the graphene layer may be different with respect to the number of graphene monolayers (i.e. graphene sheets) that are stacked. For example, in some embodiments, the graphene layer may have 1-100 layers, preferably 2-80 layers, preferably 3-50 layers, preferably 4-30 layers, preferably 5-20 layers, preferably less than 15 layers of graphene monolayers that are stacked. In one embodiment, the number of layers in the graphene layer is determined by XRD. Accordingly, the thickness of the graphene layer may preferably be no more than 50 nm, preferably no more than 20 nm, preferably no more than 15 nm, preferably no more than 10 nm, preferably in the range of 2-8 nm. In all the embodiments, the thickness of the graphene layer 106 is always lower than the average diameter of the nanoparticles 102, and thus the nanoparticles 102 serve as pillars to raise the graphene layer 106 and form a gap 113 between the graphene layer 106 and the transparent substrate 110, as shown in FIG. 1J. In some embodiments, a ratio of an average thickness of the graphene layer to an average diameter of the nanoparticles is 1:1.5 to 1:10, preferably 1:2 to 1:9, preferably 1:3 to 1:8.

As used herein, the term "graphene sheet" refers to a single layer crystalline material having a hexagonal honeycomb structure in which carbon atoms are two-dimensionally connected to each other. In some embodiments, the graphene sheet present in the composite layer 112 may be in the form of pristine graphene, graphene oxide (GO), and/or reduced graphene oxide (rGO). "Graphene oxide" as used here refers to an oxidized version of the graphene sheet, which includes one or more oxygen-containing functional groups such as, e.g., carboxylate, hydroxyl, carbonyl, epoxide, etc. Said oxygen-containing functional groups may be present on the edge of the graphene sheet and/or on the basal plane of the graphene sheet. "Reduced graphene oxide" as used here refers to a kind of graphene oxide with a lower surface concentration of the oxygen-containing functional groups, and therefore, have a lower interlayer spacing compare to the graphene oxide or pristine graphene.

In one embodiment, the graphene layer 106 present in the composite layer 112 may have an average bulk density in the range of 0.05 to 0.5 g/cc, preferably 0.1 to 0.45 g/cc, preferably 0.2 to 0.4 g/cc. A carbon content of the graphene layer 106 may be at least 95 wt %, preferably at least 98 wt %, preferably at least 99 wt %, with less than 5 wt %, preferably less than 2 wt %, preferably less than 1 wt % of impurities, wherein the weight percentile is relative to the total weight of the graphene layer. For example, in an embodiment, the graphene layer 106 may include a graphene derivative such as, for example, doped graphene, fluorographene, and/or chlorographene.

The nanoparticles 102 and the graphene layer 106 may be associated with one another through various types of interactions such as, for instance, ionic bonds, covalent bonds, non-covalent bonds, van der Waal s forces, electrostatic interactions, London dispersion forces, π-π stacking interactions, and combinations thereof.

In some preferred embodiments, the composite layer 112 further includes a dopant 108, which is dispersed in or on the graphene layer 106, as shown in FIGS. 1H, 1I, and 1J. The dopant 108 may be a p-type dopant or an n-type dopant. In terms of the present disclosure, "dopant" is a trace impurity element that is inserted into the graphene layer 106 in very low concentrations to alter electronic and/or optical properties of the composite layer 112. In some other embodiments, the addition of the dopant 108 to the graphene layer 106 turns the composite layer 112 into a p-type semiconductor (positive charge carriers) or an n-type semiconductor (negative charge carriers). The addition of the dopant 108 to the graphene layer 106 may shift Fermi levels of the graphene sheets, thus changing the electronic properties of the composite layer 112. To turn composite layer 112 into a p-type semiconductor, in some embodiment, a p-type dopant is dispersed in the graphene layer 106, wherein the p-type dopant is a boron-containing gas, preferably diborane. In an alternative embodiment, to turn composite layer 112 into an n-type semiconductor, an n-type dopant is dispersed in the graphene layer 106, wherein the n-type dopant is a nitrogen-containing gas, preferably ammonia. The p-type and the n-type dopant cannot be present in the composite layer 112 at the same time.

In one embodiment, the composite layer 112 further includes quantum dots, which may preferably be dispersed in the graphene layer 106 and/or disposed on a surface of the graphene layer 106 and/or the nanoparticles 102. As used here, the term "quantum dots" refers to semiconducting particles having diameters in the range of 1 to 10 nm, preferably 2 to 8 nm, more preferably 3 to 6 nm. The quantum dots may be added to adjust electronic properties (e.g. band-gap energy) of the composite layer 112. The quantum dots may be one or more of core-type quantum dots, core-shell quantum dots, and alloyed quantum dots, as known to those skilled in the art. Exemplary quantum dots, without limitation, include chalcogenides (i.e. selenides or sulfides) of transition metals, preferably one or more of CdSe, ZnSe, CdSs/ZnS, CdS/ZnS, CdTe, PbS, InP/ZnS, PbSe, etc.

The presence of the gap 113 between the graphene layer 106 and the transparent substrate 110 may allow electrons of graphene to freely move without interference from defects present on the surface of the substrate 110 when pulled by an electric field. In view of that, in some preferred embodiments, an electron mobility of the composite layer 112 is at least 30,000 cm$^2$/(V·s), preferably at least 40,000 cm$^2$/(V·s), preferably 40,000 to 80,000 cm$^2$/(V·s), preferably 45,000 to 70,000 cm$^2$/(V·s), preferably 50,000 to 60,000 cm$^2$/(V·s) at room temperature (i.e. a temperature of 20-30° C., preferably 22-28° C.). In view of that, an adverse effect of the presence of the transparent substrate 110 on the electron mobility of graphene in the composite layer 112 is substantially reduced. The term "electron mobility" as used here refers to a characteristic of a semiconductor that defines how quickly an electron can move through the semiconductor, when pulled by an electric field. In one embodiment, the electron mobility of the composite layer 112 is calculated by measuring a drift velocity of electrons in the composite layer 112 when exposed to an electric field (E), as known to those skilled in the art. In some embodiments, the composite layer 112 has an ambipolar activity.

In some embodiments, a surface resistivity of the composite layer 112 of the present disclosure may be in the range of 10-500Ω/square, preferably 20-400Ω/square, preferably 30-300Ω/square, preferably 40-200 Ω/square, preferably 50-100Ω/square.

In another preferred embodiment, the composite layer 112 has a light transmittance of at least 95%, preferably 96-99%, preferably 97-98%, when exposed to a light radiation with a wavelength of 300-1,000 nm, preferably 350-900 nm, preferably 400-800 nm. In view of that and the light transmittance of the transparent substrate 110, the transparent electrode 114 may have a light transmittance of at least 50%, preferably at least 60%, preferably 65-95%, preferably 75-90% when exposed to a light radiation with a wavelength of 300-1,000 nm, preferably 350-900 nm, preferably 400-800 nm.

In view of the aforementioned properties of the composite layer 112, the transparent electrode 114 may be utilized in various applications due to a high electron mobility and light transmittance, and low surface resistivity of the composite layer 112. Exemplary applications of the transparent electrode 114 include, without limitation, photovoltaic cells, solar cells, dye-sensitized solar cells, transistors, field effect transistors, etc. In any of the abovementioned applications, the composite layer 112 may be mechanically flexible or rigid.

Referring to FIGS. 2A and 2B, according to a second aspect, the present disclosure relates to a solar cell 200 that uses the transparent electrode 114 as a working electrode. In terms of the present disclosure, a solar cell is a device that collects solar radiation and creates electrical charges to power an external electrical circuit or an electric device. A solar cell has a transparent front side that faces the sun during normal operation to collect solar radiation and a backside opposite the transparent front side. Solar radiation impinging on the solar cell creates electrical charges via a photovoltaic effect.

Accordingly, the solar cell 200 in accordance with the second aspect includes the transparent electrode 114 that faces the sun to collect solar radiation 210, a cathode 204 (or counter electrode) and an electrolyte 206 arranged between the transparent electrode 114 and the cathode 204, wherein the transparent electrode 114 is in electric communication with the cathode 204 through the electrolyte 206. When the graphene layer 106 in the transparent electrode 114 absorbs solar radiation 210, electrons in the graphene layer turn into excited electrons and are injected into a conduction band of the graphene layer. Said electrons may flow to the cathode 204 (or the counter electrode) through an outer circuit including a load 208. The cathode 204 (counter electrode) is mainly used for collecting electrons and accelerating electron exchange rates between the electrolyte 206 and the cathode 204 (or counter electrode). The high electron mobility in the composite layer 112 of the transparent substrate 110 may increase an efficiency of the solar cell 200 by at least 10%, preferably at least 20%, preferably 30-60%, relative to the efficiency of a conventional solar cell that includes a conventional working electrode in lieu of the transparent electrode 114.

The cathode 204 may preferably be a conductive material selected from the group consisting of gold, platinum, silver, copper, aluminum, zinc, nickel, iron, tin, lead, and alloys or combinations thereof. In a preferred embodiment, the conductive material of the cathode 204 is an electrochemically stable material such as, e.g., platinum, gold, carbon, and the like. In one embodiment, the cathode 204 may be a planar electrode that is disposed parallel and across from the transparent electrode 114, as shown in FIG. 2A. In certain embodiments, the transparent electrode 114 is in the form of a hollow cylinder and the cathode 204 is a cylinder that is disposed inside the transparent electrode 114 and the electrolyte 206 is arranged therebetween. An electrical conductivity of the cathode 204 at room temperature (i.e. a temperature of 20-30° C., preferably 22-28° C.) may be preferably within the range of $3.0 \times 10^6$ to $7.0 \times 10^7$ s/m, preferably $5.0 \times 10^6$ to $5.0 \times 10^7$ s/m, preferably $10^7$ to $2.0 \times 10^7$ s/m.

The electrolyte 206 as used here refers to a non-metallic element of the solar cell 200 that electronically/ionically connects the transparent electrode 114 to the cathode 204. In a preferred embodiment, the electrolyte 206 contains an aqueous sodium bicarbonate solution with a concentration of 0.1 to 5.0 M, preferably 0.2 to 4.0 M, preferably 0.3 to 3.0 M. The electrolyte 206 may be one or more of sodium chloride, sodium carbonate, potassium nitrate, calcium chloride, sodium hydroxide, potassium hydroxide, sodium acetate, and magnesium hydroxide. The electrolyte 206 may include at least one conductive polymer selected from the group consisting of polypyrrole, polyaniline, polythiophene, poly(3,4-ethylenedioxy-thiophene), poly(3-alkylthiophenes), polyacetylene, polyphenylene vinylene, and polyphenylene sulfide. The electrolyte 206 may include an ionic liquid such as, for example, 2-methylimidazole, 2-ethyl-4-methylimidazole, 2-benzyl-4-methylimidazole, 1-(2-cyanoethyl)-2-ethyl-4-methylimidazole, 1-cyanoethyl-2-methylimidazole, 1-(2-cyanoethyl)2-phenyl-4,5-di-(cyanoethoxymethyl) imidazole, and combinations thereof. In another embodiment, the electrolyte 206 solution may include an organic solvent, a halogenated metal salt, and/or a halogenated nitrogen-containing heterocyclic compound. The electrolyte 206 may have a pH in the range of 6 to 10, preferably 7 to 9. The electrolyte 206 may be present in a liquid state or in a solid state.

Alternatively, the transparent electrode 114 may be utilized in various types of solar cells or photovoltaic cells as known to those skilled in the art including, for example, amorphous silicon solar cells, biohybrid solar cells, buried contact solar cells, cadmium telluride solar cells, concentrated PV solar cells, copper indium gallium selenide solar cells, dye-sensitized solar cells, gallium arsenide germanium solar cells, hybrid solar cells, luminescent solar concentrator cells, micromorph cells, monocrystalline solar cells, multi-junction solar cells, nanocrystal solar cells, organic solar cells, perovskite solar cells, photoelectrochemical cells, plasmonic solar cells, plastic solar cells, polycrystalline solar cells, polymer solar cells, quantum dot solar cells, solid-state solar cells, thin-film solar cells, and wafer solar cells.

Referring to FIGS. 2C and 2D, one aspect of the present disclosure relates to a dye-sensitized solar cell 202 that uses the transparent electrode 114 as a working electrode.

A dye-sensitized solar cell, as used here, refers to an electrical device that converts the energy of light directly into electricity (i.e. a photoelectric conversion mechanism) by a photovoltaic effect through the use of dye particles. Accordingly, the dye-sensitized solar cell 202 includes the transparent electrode 114 that faces the sun to collect solar radiation 210, a cathode 204, an electrolyte 206 arranged between the transparent electrode 114 and the cathode 204, optionally a plurality of semiconducting particles 212 disposed in the electrolyte 206, and dye particles 214 arranged on the semiconducting particles 212. Accordingly, the transparent electrode 114 is in electric communication with the cathode 204 through the electrolyte 206. When the dye-sensitized solar cell 202 is exposed to solar radiation 210, the dye particles 214 absorb energy from the solar radiation 210, and electrons in the dye particles 214 turn into excited electrons and injected into a conduction band of the semiconducting particles 212, thereby causing the dye particles 214 to oxidize due to loss of electrons. In the embodiments where semiconducting particles 212 is not present, the excited electrons are injected into a conduction band of the composite layer 112, which is an n-type semiconductor. The electrons that are injected into the conduction band of the semiconducting particles 212, may accumulate on the transparent electrode 114, and may further flow to the cathode 204 through an outer circuit including a load 208. On the other hand, oxidized dye particles accept electrons from the electrolyte 206 and return to the ground state. The electron donor in the electrolyte 206 diffuses to the cathode 204 and accepts an electron and is reduced at the cathode 204. The high electron mobility in the composite layer 112 of the transparent substrate 110 may increase an efficiency of the dye-sensitized solar cell 202 by at least 10%, preferably at least 20%, preferably 30-60%, relative to the efficiency of a conventional dye-sensitized solar cell that includes a conventional working electrode in lieu of the transparent electrode 114.

The semiconducting particles 212, when present, may preferably be n-type semiconductors that are multi-component nanocomposite particles preferably with a perovskite structure. The multi-component nanocomposite particles may be an oxide of a metal selected from the group consisting of Ti, Zr, Sr, Zn, In, Yr, La, V, Mo, W, Sn, Nb, Mg, Al, Y, Sc, Sm, Ga, and TiSr. For example, the multi-component nanocomposite particles may be $TiO_2$, $SnO_2$, ZnO, $WO_3$, $Nb_2O_5$, $TiSrO_3$, or a mixture thereof. The semiconducting particles 212, when present, may preferably be arranged between the transparent electrode 114 and the cathode 204 preferably in direct contact with the composite layer 112 of the transparent electrode 114, as shown in FIG. 2D.

The dye particles 214 may preferably be utilized to enhance the absorption of light photons onto the transparent electrode 114 and/or the semiconducting particles 212, when present. The dye particles 214 may include an azin dye, an azo dye, a diarylmethane dye, a fluorescent dye, a food coloring, a fuel dye, an ikat dye, an indigo structured dye, an indophenol dye, a perylene dye, a phenol dye, a quinoline dye, a rhodamine dye, a solvent dye, a staining dye, a thiazine dye, a thiazole dye, a triarylmethane dye, a vat dye, a violanthrone dye, etc. For example, in one embodiment, the dye particles 214 include is a thiazine dye, in particular, methylthioninium chloride (methylene blue). In certain embodiments, the dye particles 214 may include a ruthenium complex, for example, a xanthine-based pigment (e.g. rhodamine B, rose bengal, eosin, or erythrocin), a cyanine-based pigment (e.g. quinocyanine, merocyanine, naphthalocyanine, or cryptocyanine), a basic dye (e.g. phenosafranine, Capri blue, thiocine, or methyleneblue), a phosphirine-based compound (e.g. chlorophyll, zinc phosphirine, or magnesium phosphirine), other azo pigments, a complex compound (e.g. a phthalocyanine compound, or Ru trisbipyridyl), an anthraquinone-based pigment, or a polycyclic quinine-based pigment.

According to a third aspect, the present disclosure relates to a method of fabricating the transparent electrode 114.

The method involves depositing the nanoparticles 102 on a surface of a CVD substrate 104. Depositing the nanoparticles 102 on the surface of the CVD substrate 104 may be carried out using methods known to those skilled in the art, for example, dispersion, drop-casting, sputtering, physical application, spraying, vapor-coating, chemical vapor deposition (CVD), and combinations thereof.

In a preferred embodiment, the nanoparticles 102 are dispersed in an organic solvent, and further sonicated, preferably ultra-sonicated to form a deposition precursor. The deposition precursor is then sprayed on the CVD substrate 104. The deposition precursor may alternatively be deposited by any methods as known to those skilled in the art including, without limitation, brushing, dipping, drop-coating, pouring, or spin-coating. In some preferred embodiments, an automatic spray gun, e.g. a spray atomizer, is utilized to uniformly spray the deposition precursor onto the CVD substrate 104. The organic solvent may be an alcohol-based organic solvent, an ether-based organic solvent, a ketone-based organic solvent, an ester-based organic solvent and/or an organic acid-based organic solvent.

Once the deposition precursor is dispersed, the CVD substrate 104 is heated to a temperature above a boiling temperature of the organic solvent to evaporate the organic solvent to form a layer of the nanoparticles 102 on the CVD substrate 104.

In some embodiments, the nanoparticles 102 are deposited on the surface of the CVD substrate 104 in an inert environment, which is provided by a stream of an inert gas such as, without limitation, $N_2$, Ar, He, and combinations thereof.

In one embodiment, the CVD substrate 104 is any kind of substrates that commonly utilized in chemical vapor deposition, as known to those skilled in the art. For example, in a preferred embodiment, the CVD substrate 104 is a copper substrate. The CVD substrate 104 may alternatively be a cobalt substrate or a nickel substrate. In certain embodiments, the CVD substrate 104 may include at least one element selected from the group consisting of Cu, Ni, Co, Fe, Pt, Au, Al, Cr, Mg, Mn, Mo, Rh, Si, Ta, Ti, W, U, V, and Zr. The CVD substrate 104 may have various sizes and shapes. For instance, in some embodiments, the CVD substrate 104 may have surface sizes that range from about 10 nm to about 10 cm in length or width. In some embodiments, the CVD substrate 104 may be pre-patterned. In some embodiments, the CVD substrate 104 may be in the shapes of squares, rectangles, triangles, or other similar shapes. In some embodiments, the CVD substrate 104 may be planar, rolled or coiled.

In some embodiments, the methods of the present disclosure also include a step of cleaning the CVD substrate 104 prior to depositing the nanoparticles 102 thereon. For example, in one embodiment, the cleaning involves electrochemical-polishing the CVD substrate by applying a voltage to the CVD substrate and polishing the CVD substrate for a certain amount of time. For instance, in more specific embodiments, electrochemical polishing may include applying a voltage of about 0.5 V or higher to the surface of the CVD substrate, and polishing the surface of the CVD substrate for about 10 seconds or longer. In some embodiments, the cleaning of CVD substrate may occur by mechanical polishing, acid cleaning, and/or high temperature annealing under reductive or inert atmospheres.

In certain embodiments, the deposition precursor may subsequently be dispersed on the CVD substrate 104 for at least one cycle after evaporation of the organic solvent, to form at least one layer of nanoparticles on the CVD substrate. Alternative to the abovementioned deposition method, the nanoparticles may be deposited on the surface of the CVD substrate by a method such as screen printing, doctor blade coating, gravure coating, silk screening, painting, slit die coating, roll coating, decalcomania coating, and combinations thereof. Selection of a suitable method of depositing the nanoparticles on the surface of the CVD substrate may depend on the type of the nanoparticles and a viscosity of the deposition precursor.

Once the nanoparticles 102 are deposited on the surface of the CVD substrate 104, in a next step, graphene is deposited on the CVD substrate 104, for example, using chemical vapor deposition (CVD) as known to those skilled in the art. Accordingly, the CVD substrate with the nanoparticles are first heated to a temperature of at least 900° C., preferably 1050-1200° C., preferably around 1000° C. in a sub-atmospheric pressure, e.g. a pressure of less than 0.8 atm, preferably less than 0.2 atm, preferably less than 0.1 atm. The CVD substrate with the nanoparticles may be heated in a furnace or an oven, preferably a vacuum oven. In some embodiments, CVD substrate and the nanoparticles deposited thereon may be heated with induction heating using various energy sources such as RF radiating energy, for example, lasers, infrared rays, microwaves, high energy X-rays, and combinations thereof.

In some embodiments, the CVD substrate and the nanoparticles are heated in an inert environment, which is preferably provided by a stream of an inert gas such as, without limitation, $N_2$, Ar, He, and combinations thereof. The inert gas may be applied to at a flow rate of 5-500 sccm, preferably 50-100 sccm, and a pressure of 1-20 Torr, preferably 2-10 Torr.

Figure 1E:
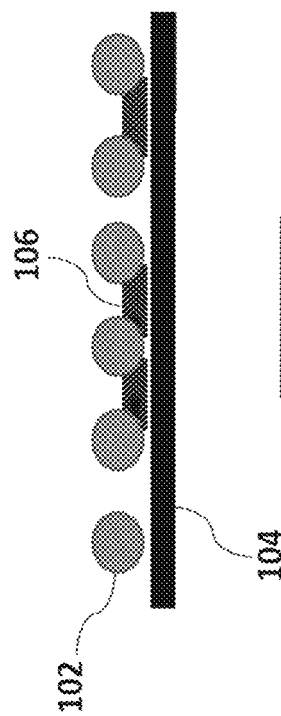
FIG. 1E schematically illustrates a side-view of the CVD substrate during depositing graphene.
Figure 1D:
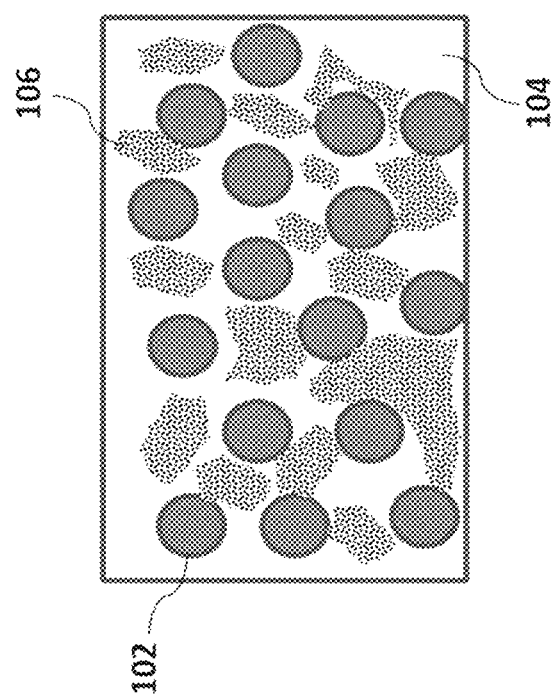
FIG. 1D schematically illustrates a top-view of the CVD substrate during depositing graphene.
Figure 1G:
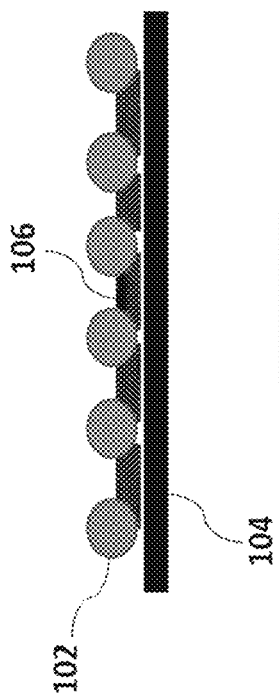
FIG. 1G schematically illustrates a side-view of the CVD substrate after depositing graphene thereon.
Figure 1F:
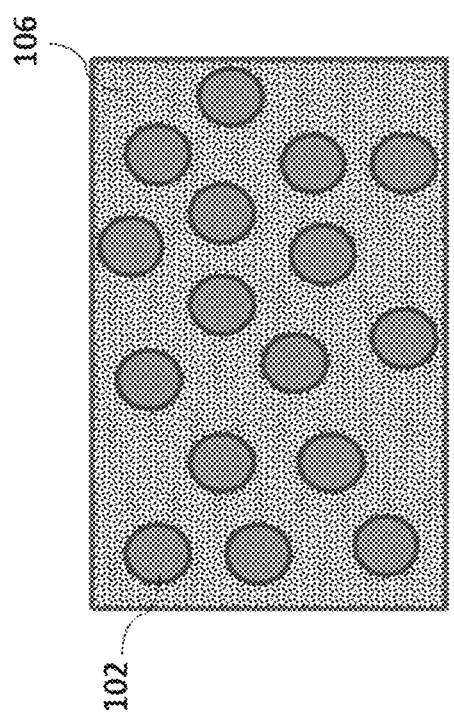
FIG. 1F schematically illustrates a top-view of the CVD substrate after depositing graphene thereon.

Once the CVD substrate and the nanoparticles are equilibrated at the temperature of at least 900° C., preferably 1050-1200° C., preferably around 1000° C. in the sub-atmospheric pressure, a gaseous mixture comprising methane and hydrogen is contacted with the nanoparticles and the CVD substrate, wherein hydrogen catalyzes a reaction between methane and the CVD substrate, thus causing carbon atoms to be deposited on the surface of the CVD substrate through a chemical adsorption process. Accordingly, the carbon atoms are deposited on the CVD substrate in the form of graphene sheets, thus forming the graphene layer 106. Due to the existence of the nanoparticles on the surface of the CVD substrate, the graphene grows on those surface areas that are not occupied by the nanoparticles 102, as shown in FIGS. 1D and 1E. As a result, the graphene layer 106 surrounds the nanoparticles 102 such that the nanoparticles are embedded in the graphene layer and extend through a thickness of the graphene layer. A growth rate of the graphene layers may preferably be controlled by controlling a temperature and a flow rate of the gaseous mixture, such that the ratio of an average thickness of the graphene layer 106 to an average diameter of the nanoparticles 102 ranges from 1:1.5 to 1:10, preferably 1:2 to 1:9, preferably 1:3 to 1:8. The gaseous mixture is contacted with the nanoparticles 102 and the CVD substrate 104 for a period of 1-10 minutes, preferably 2-8 minutes, preferably 4-6 minutes to form the graphene layer. The graphene layer may preferably include multiple layers of graphene sheet that are stacked together and are weakly bonded by Van der Waals and/or π-π stacking interactions. The graphene layer may preferably include crystalline and polycrystalline layers, although in certain embodiments formation of amorphous carbon is also envisaged. The graphene layer may include from 1 to about 100 monolayers, preferably 1 to about 50 monolayers, from 1 to about 20 monolayers, preferably from 1 to about 10 monolayers, preferably from 1 to about 5 monolayers of graphene sheets. The term "monolayer" as used herein in connection with graphene refers to a single atom-thick layer of graphene or "graphene sheet." In terms of the present disclosure, the term "monolayer" and the term "graphene sheet" are identical and may be used interchangeably.

In certain embodiments, the gaseous mixture further includes a dopant 108, which may be a p-type dopant or an n-type dopant. Accordingly, a trace amount of the dopant 108 may be inserted into the composite layer 112 during formation of the graphene layer. In view of that, a p-type semiconductor (positive charge carriers) or an n-type semiconductor (negative charge carriers) may be fabricated by adding a p-type dopant or an n-type dopant in a composition of the gaseous mixture. For example, in one embodiment, the gaseous mixture includes diborane, and the composite layer 112 turns into a p-type semiconductor. In an alternative embodiment, the gaseous mixture includes ammonia, and the composite layer 112 turns into an n-type semiconductor.

After contacting the gaseous mixture and formation of the composite layer, the CVD substrate 104 and the composite layer 112 formed thereon is cooled preferably at a cooling rate of 10-30° C./min, preferably 15-25° C./min. Cooling the CVD substrate 104 and the composite layer 112 at the abovementioned cooling rates preferably prevent formation of bulk graphite.

Referring to FIG. 1J step (1), the method further involves disposing/placing the transparent substrate 110 on the CVD substrate 104 and the composite layer 112. Accordingly, the transparent substrate 110, which may preferably be in the form of a pellet, is placed on the composite layer 112, wherein the transparent substrate 110 is in direct contact with the nanoparticles 102 and a gap 113 is present between the transparent substrate 110 and the graphene layer 106.

In some preferred embodiments, the transparent substrate 110 in the form of pellets, are pre-treated to form oxygen functional groups, e.g., hydroxyl, carbonyl, carboxyl, aldehyde, etc., on the surface of the transparent substrate 110 before disposing/placing on the composite layer 112. Such pre-treatment steps may involve one or more of plasma treatment, acid-treatment, corona treatment, and flame treatment. The presence of the aforementioned oxygen functional groups on a surface of the transparent substrate may facilitate the step of disposing/placing the transparent substrate on the composite layer, and may prolong a life time of the transparent electrode.

To carry out a plasma treatment, the pellets of the transparent substrate 110 may preferably be placed in a plasma chamber, and a plasma gas with a sub-atmospheric pressure (i.e. a pressure of 0.9 atm to vacuum, or preferably 0.6 atm to 0.1 atm, or preferably 0.4 atm to 0.2 atm) may be introduced into the plasma chamber. The plasma gas may preferably be oxygen, ammonia, argon, and/or nitrogen, although an inert gas such as helium may also be used. As used herein, the term "plasma gas" may refer to a gaseous matter that contains ions and electrons. One way to form the plasma gas may be through electrically charging an inert gas. Plasma treating the transparent substrate may form oxygen functional groups, e.g., hydroxyl, carbonyl, carboxyl, aldehyde, etc. on a portion of a surface of the transparent substrate by causing ions and electrons present in the plasma gas to interact with the surface of the transparent substrate. The transparent substrate may be plasma treated for 1 to 5 minutes, preferably 2 to 4 minutes under the plasma gas. After plasma treating, the transparent substrate may be washed with an organic solvent, e.g. acetone, an alcohol (e.g., ethanol), toluene, water, etc.

The transparent substrate may have chemically inert and nonporous surfaces with a low surface tension, thus being non-receptive to create bonds with the nanoparticles of the composite layer. Accordingly, in some embodiments, the transparent substrate may be corona treated. In view of that, the pellets of the transparent substrate may be subjected to a plasma that may be generated in air at an atmospheric pressure (i.e. about 1 atm) by applying an AC voltage to two electrodes of a corona treating device. The plasma may contain a number of energetic ions and electrons that may form oxygen functional groups, e.g., hydroxyl, carbonyl, carboxyl, aldehyde, etc. on a portion of the surface of the transparent substrate. Corona treating the transparent substrate may enhance a surface energy of the transparent substrate. Corona treating may further enhance a surface roughness of the transparent substrate by oxidizing a portion of the surface of the transparent substrate, thus improving adhesion bonds between the transparent substrate and the nanoparticles of the composite layer.

In some embodiments, the transparent substrate may be acid-treated with an acid solution in order to remove impurities from the surfaces of the transparent substrate. Acid-treating the transparent substrate may considerably affect a surface morphology and/or a surface chemistry of the transparent substrate, for example, by creating oxygen functional groups, e.g., hydroxyl, carbonyl, carboxyl, aldehyde, etc. on the surface of the transparent substrate. Exemplary acid solutions that may be utilized here include, without limitation, an iodic acid solution, a permanganic acid solution, a nitric acid solution, and/or a chromic acid solution. Preferably, the concentration of the acid solutions may be less than 2.0 M, preferably less than 1.5 M.

Additionally, the transparent substrate may be flame treated preferably to break a portion of molecular chains on a surface of the transparent substrate, thus creating polar functional groups on the surface of the transparent substrate. Accordingly, the transparent substrate may be subjected to a blue flame, e.g. an oxygen-containing propane flame or an oxygen-containing acetylene flame for a few seconds, preferably no more than 20 seconds, preferably no more than 10 seconds. Additionally, flame treating the transparent substrate may advantageously burn off dust particles, and impurities that may be present on the surface of the transparent substrate and adversely affect bonding strength between the transparent substrate and the nanoparticles.

In certain embodiments, disposing/placing the transparent substrate 110 on the composite layer 112 may be carried out by spin/spray coating a polymeric solution onto the composite layer 112, followed by a drying step. The polymeric solution may be formed by dissolving the transparent polymeric material, as mentioned previously, in an organic solvent. In a preferred embodiment, the polymeric solution is formed by dissolving polymethylmethacrylate and/or polydimethylsiloxane in the organic solvent. Examples of the organic solvent that may be utilized here include, without limitation, an alcohol-based organic solvent, an ether-based organic solvent, a ketone-based organic solvent, an ester-based organic solvent and/or an organic acid-based organic solvent. Examples of alcohol-based organic solvents may include monovalent alcohols and polyvalent alcohols, which may be used alone or in a combination thereof. Examples of monovalent alcohols may include propanol, pentaol, hexanol, heptanol, and octanol, and examples of polyvalent alcohols may include propylene glycol, diethylene glycol, dipropylene glycol, triethylene glycol, tripropylene glycol, octylene glycol, tetraethylene glycol, neopentyl glycol, 1,2-butandiol, 1,3-butandiol, 1,4-butandiol, 2,3-butandiol, 1,2-dimethyl-2,2-butandiol, and 1,3-dimethyl-2,2-butandiol.

Referring to FIG. 1J step (2), after disposing/placing the transparent substrate 110 on the composite layer 112, the CVD substrate 104 is removed, preferably with an etchant, leaving behind the transparent electrode 114, wherein the nanoparticles 102 are in direct contact with the transparent substrate 110 and a gap 113 is present between the graphene layer 106 and the transparent substrate 110. In one embodiment, the etchant is preferably a ferric chloride solution. The ferric chloride solution may be 10-50% by weight, preferably 30-45% by weight of ferric chloride. The CVD substrate may preferably be etched in a commercially available etching machine. Alternative etchants may also be utilized to remove the CVD substrate such as, for example, ammonium hydroxide, cupric chloride, chromium trioxide, and sulfuric acid. In one embodiment, the etchant may be an aqueous solution of $(NH_4)_2S_2O_8$ with 1% by volume of butanol.

Referring to FIG. 1J step (3) and (4), in some embodiments, the transparent substrate 110 is removed with the organic solvent, thus leaving behind the composite layer 112. Accordingly, the composite layer 112 may be subjected to further processing steps to be utilized in various applications, e.g. solar cells, transistors, etc. For example, in some embodiments, the method further involves the steps of transferring the composite layer 112 onto a pre-treated substrate 115 (e.g. a plasma treated substrate) such as, without limitation, $SiO_2$/Si wafers, $Al_2O_3$, $Si_3N_4$, SiC, and combinations thereof. In one embodiment, transferring the composite layer 112 involves dipping the composite layer 112 into a solution. In another embodiment, transferring the composite layer 112 involves manually placing the composite layer 112 onto the pre-treated substrate 115. Additional methods by which to remove the composite layer 112 from the transparent substrate 110 and/or to transfer the composite layer to another substrate is also be envisioned.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A solar cell comprising:
a transparent electrode;
a planar cathode made from one or more of gold, platinum, silver, copper, aluminum, zinc, nickel, iron, tin, lead, and alloys thereof; and
an electrolyte arranged between the transparent electrode and the planar cathode, wherein the transparent electrode is in electric communication with the planar cathode through the electrolyte,
wherein the planar cathode is disposed parallel and across from the transparent electrode;
wherein the transparent electrode comprises:
a transparent substrate, and
a composite layer disposed on the transparent substrate, wherein the composite layer comprises:
a graphene layer and a plurality of nanoparticles, wherein the nanoparticles are embedded in the graphene layer and extend through a thickness of the graphene layer,
wherein a ratio of the thickness of the graphene layer to an average diameter of the plurality of nanoparticles is 1:1.5 to 1:10,
wherein at least a portion of the plurality of nanoparticles are in direct contact with the transparent substrate and a gap is present between the graphene layer and the transparent substrate,
wherein the transparent substrate consists of one or more materials selected from the group consisting of quartz, glass, polymethylmethacrylate, polydimethylsiloxane, polymethacrylate, and polycarbonate.

2. The solar cell of claim 1, wherein the plurality of nanoparticles are at least one selected from the group consisting of a boron nitride nanotube, a boron nitride fullerene, a titanium oxide nanotube, and a titanium oxide fullerene.

3. The solar cell of claim 1, wherein the plurality of nanoparticles are boron nitride nanotubes with an average diameter of 3-10 nm.

4. The solar cell of claim 1, wherein a morphology of the plurality of nanoparticles is at least one selected from the group consisting of a tubular morphology, a spherical morphology, an elliptical morphology, and an oblong morphology.

5. The solar cell of claim 1,
wherein the gap defines a distance between the graphene layer and the transparent substrate, and
wherein an average size of the gap is 0.1-10 nm.

6. The solar cell of claim 1, wherein the composite layer further comprises a p-type dopant, which is dispersed in the graphene layer.

7. The solar cell of claim 6, wherein the p-type dopant is diborane.

8. The solar cell of claim 1, wherein the composite layer further comprises an n-type dopant, which is dispersed in the graphene layer.

9. The solar cell of claim 8, wherein the n-type dopant is ammonia.

10. The solar cell of claim 1, wherein the composite layer further comprises quantum dots.

11. The solar cell of claim 1, wherein the composite layer has an electron mobility of at least 30,000 $cm^2/(V \cdot s)$ at a temperature of 20-30° C.

12. The solar cell of claim 1, wherein the composite layer has a light transmittance of at least 95% when exposed to a light radiation with a wavelength of 300 to 1,000 nm.

* * * * *